(12) United States Patent
Visser et al.

(10) Patent No.: US 9,673,042 B2
(45) Date of Patent: Jun. 6, 2017

(54) METHODS AND APPARATUS FOR IN-SITU CLEANING OF COPPER SURFACES AND DEPOSITION AND REMOVAL OF SELF-ASSEMBLED MONOLAYERS

(71) Applicant: APPLIED MATERIALS, INC., Santa Clara, CA (US)

(72) Inventors: Robert Jan Visser, Menlo Park, CA (US); Ranga Rao Arnepalli, Krishna (IN); Prerna Goradia, Mumbai / Maharashtra (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/842,806

(22) Filed: Sep. 1, 2015

(65) Prior Publication Data

US 2017/0062210 A1    Mar. 2, 2017

(51) Int. Cl.
*H01L 21/02* (2006.01)
*C23C 16/02* (2006.01)
(Continued)

(52) U.S. Cl.
CPC .... *H01L 21/02271* (2013.01); *C23C 16/0227* (2013.01); *C23C 16/24* (2013.01);
(Continued)

(58) Field of Classification Search
CPC ......... H01L 21/02109; H01L 21/02296; H01L 21/64; H01L 21/70; H01L 21/702; H01L 21/71
See application file for complete search history.

(56) References Cited

U.S. PATENT DOCUMENTS

| 5,409,543 A | 4/1995 | Panitz et al. |
| 6,107,197 A | 8/2000 | Suzuki |
| (Continued) | | |

FOREIGN PATENT DOCUMENTS

| JP | 06-097139 A | 4/1994 |
| JP | 11-202099 A | 7/1999 |
| (Continued) | | |

OTHER PUBLICATIONS

International Search Report and Written Opinion mailed Apr. 17, 2012 for PCT Application No. PCT/US2011/057022.

(Continued)

*Primary Examiner* — Cheung Lee
(74) *Attorney, Agent, or Firm* — Moser Taboada; Alan Taboada

(57) ABSTRACT

A method of processing includes: providing a substrate having a contaminant material disposed on the copper surface to a substrate support within a hot wire chemical vapor deposition (HWCVD) chamber; providing hydrogen ($H_2$) gas to the HWCVD chamber; heating one or more filaments disposed in the HWCVD chamber to a temperature sufficient to dissociate the hydrogen ($H_2$) gas; exposing the substrate to the dissociated hydrogen ($H_2$) gas to remove at least some of the contaminant material from the copper surface; cooling the one or more filaments to room temperature; exposing the substrate in the HWCVD chamber to one or more chemical precursors to deposit a self-assembled monolayer atop the copper surface; and depositing a second layer atop the substrate.

20 Claims, 8 Drawing Sheets

(51) Int. Cl.
*C23C 16/24* (2006.01)
*C23C 16/56* (2006.01)
*H01L 21/768* (2006.01)

(52) U.S. Cl.
CPC ........ *C23C 16/56* (2013.01); *H01L 21/02043* (2013.01); *H01L 21/02068* (2013.01); *H01L 21/02301* (2013.01); *H01L 21/02312* (2013.01); *H01L 21/76831* (2013.01)

(56) References Cited

U.S. PATENT DOCUMENTS

| | | |
|---|---|---|
| 6,319,728 B1 | 11/2001 | Bhan et al. |
| 6,375,756 B1 | 4/2002 | Ishibashi |
| 6,410,454 B1 | 6/2002 | Muranaka et al. |
| 6,881,277 B2 | 4/2005 | Pan |
| 7,220,665 B2 | 5/2007 | Farrar |
| 7,604,708 B2 | 10/2009 | Wood et al. |
| 7,727,590 B2 | 6/2010 | Richardson et al. |
| 8,043,976 B2 | 10/2011 | Vrtis et al. |
| 8,492,287 B2 | 7/2013 | Tahara |
| 8,709,537 B2 | 4/2014 | Thakur et al. |
| 2001/0031541 A1 | 10/2001 | Madan et al. |
| 2002/0104481 A1 | 8/2002 | Chiang et al. |
| 2002/0157688 A1 | 10/2002 | Joo |
| 2002/0189545 A1 | 12/2002 | Matsumura et al. |
| 2004/0219789 A1 | 11/2004 | Wood et al. |
| 2008/0001101 A1 | 1/2008 | Wilhelmus Van Herpen et al. |
| 2008/0138994 A1 | 6/2008 | Ueda et al. |
| 2009/0003851 A1 | 1/2009 | Nishi |
| 2009/0038541 A1 | 2/2009 | Robbins et al. |
| 2010/0263717 A1 | 10/2010 | Wang et al. |
| 2010/0288302 A1 | 11/2010 | Ehm et al. |
| 2011/0104848 A1 | 5/2011 | Haas et al. |
| 2011/0217840 A1 | 9/2011 | Ko et al. |
| 2011/0232845 A1 | 9/2011 | Riker et al. |
| 2012/0295419 A1 | 11/2012 | Chatterjee et al. |
| 2012/0312326 A1 | 12/2012 | Chatterjee et al. |
| 2013/0041084 A1 | 2/2013 | Chatterjee et al. |
| 2013/0048987 A1 | 2/2013 | Chatterjee et al. |
| 2013/0065401 A1 | 3/2013 | Chatterjee et al. |
| 2013/0160794 A1 | 6/2013 | Griffith Cruz et al. |
| 2013/0302595 A1 | 11/2013 | Liu et al. |
| 2014/0179110 A1 | 6/2014 | Park et al. |

FOREIGN PATENT DOCUMENTS

| | | |
|---|---|---|
| JP | 2004-103745 A | 4/2004 |
| KR | 10-2013-0039947 A | 4/2013 |

OTHER PUBLICATIONS

International Search Report and Written Opinion mailed Jan. 24, 2013 for PCT Application No. PCT/US2012/041078.

International Search Report and Written Opinion mailed Mar. 4, 2013 for PCT Application No. PCT/US2012/054575.

International Search Report and Written Opinion mailed Apr. 29, 2013 for PCT Application No. PCT/US2012/071202.

International Search Report and Written Opinion mailed Apr. 28, 2014 for PCT Application No. PCT/US2013/075883.

Knoesen et al., "Extension of the Lifetime of Tantalum Filaments in the Hot-Wire (Cat) Chemical Vapor Deposition Process," Thin Solid Films 516 (2008) pp. 822-825.

Hrunski et al., "Problem of Catalyst Ageing During the Hot-Wire Chemical Vapour Deposition of Thin Silicon Films," Thin Solid Films 517 (2009) pp. 3370-3377.

International Search Report and Written Opinion mailed Nov. 29, 2016 for PCT Application No. PCT/US2016/049785.

METHODS AND APPARATUS FOR IN-SITU CLEANING OF COPPER SURFACES AND DEPOSITION AND REMOVAL OF SELF-ASSEMBLED MONOLAYERS

FIELD

Embodiments of the present disclosure generally relate to in-situ cleaning of copper surfaces and deposition and removal of self-assembled monolayers.

BACKGROUND

In the semiconductor industry, the main challenge in dealing with the surfaces of copper (Cu) substrates is such surfaces when exposed to the environment, even to a clean room environment, form a thin surface oxide layer, for example a thin surface layer containing $Cu(OH)_2$, CuO, $Cu_2O$, and $CuCO_3$. Proper cleaning of the copper surface is needed to properly deposit other layers in a device stack. Typical methods of cleaning the oxidized Cu surfaces include a wet chemical clean, plasma cleaning, or an ozone treatment. However, the inventors have observed that wet cleaning processes can undesirably contaminate the copper surface due to the usage of various acids and other chemicals. A plasma based cleaning process undesirably can damage the copper surface, especially when a thin layer of copper, for example about 25 nm to about 50 nm, is treated.

Accordingly, the inventors have developed improved methods and apparatus for in-situ cleaning of copper surfaces and deposition and removal of self-assembled monolayers.

SUMMARY

Methods and apparatus for in-situ cleaning of copper surfaces and deposition and removal of self-assembled monolayers are provided herein. In some embodiments, a method of processing a substrate having an exposed copper surface includes (a) providing a substrate having a contaminant material disposed on the copper surface to a substrate support within a hot wire chemical vapor deposition (HW-CVD) chamber; (b) providing hydrogen ($H_2$) gas to the HWCVD chamber; (c) heating one or more filaments disposed in the HWCVD chamber to a temperature sufficient to dissociate the hydrogen ($H_2$) gas; (d) exposing the substrate to the dissociated hydrogen ($H_2$) gas to remove at least some of the contaminant material from the copper surface; (e) cooling the one or more filaments to room temperature; (f) exposing the substrate in the HWCVD chamber to one or more chemical precursors to deposit a self-assembled monolayer atop the copper surface; and (g) depositing a second layer atop the substrate.

In some embodiments, method of processing a substrate having an exposed copper surface includes: providing a substrate having a contaminant material disposed on the copper surface to a substrate support within a hot wire chemical vapor deposition (HWCVD) chamber; providing hydrogen (H2) gas to the HWCVD chamber; heating one or more filaments disposed in the HWCVD chamber to a temperature of about 1000 to about 2400 degrees Celsius to dissociate the hydrogen ($H_2$) gas and heating the substrate support to a temperature of about 50 to about 400 degrees Celsius; exposing the substrate to the dissociated hydrogen ($H_2$) gas to remove at least some of the contaminant material from the copper surface; cooling the one or more filaments to room temperature; heating one or more ampoules coupled to the HWCVD chamber and containing one or more chemical precursors to a temperature of about 25 to about 200 degrees Celsius; drawing a vapor of the one or more chemical precursors from the one or more ampoules using a carrier gas; exposing the substrate in the HWCVD chamber to one or more chemical precursors to deposit a self-assembled monolayer atop the copper surface, wherein the substrate is heated to a temperature of about 25 to about 350 degrees Celsius; wherein a pressure in the HWCVD chamber during deposition of the self-assembled monolayer is about 80 mTorr to about 500 Torr, and wherein the substrate is exposed to the one or more precursors for about 30 to about 600 seconds; and depositing a second layer atop the substrate.

In some embodiments, a computer readable medium, having instructions stored thereon which, when executed, cause a process chamber to perform a method for processing a substrate having an exposed copper surface and an exposed silicon-containing surface. The method may include any of the embodiments disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 3A depicts a detail of the apparatus depicted in FIG. 3 in accordance with some embodiments of the present disclosure.

Figure 1:
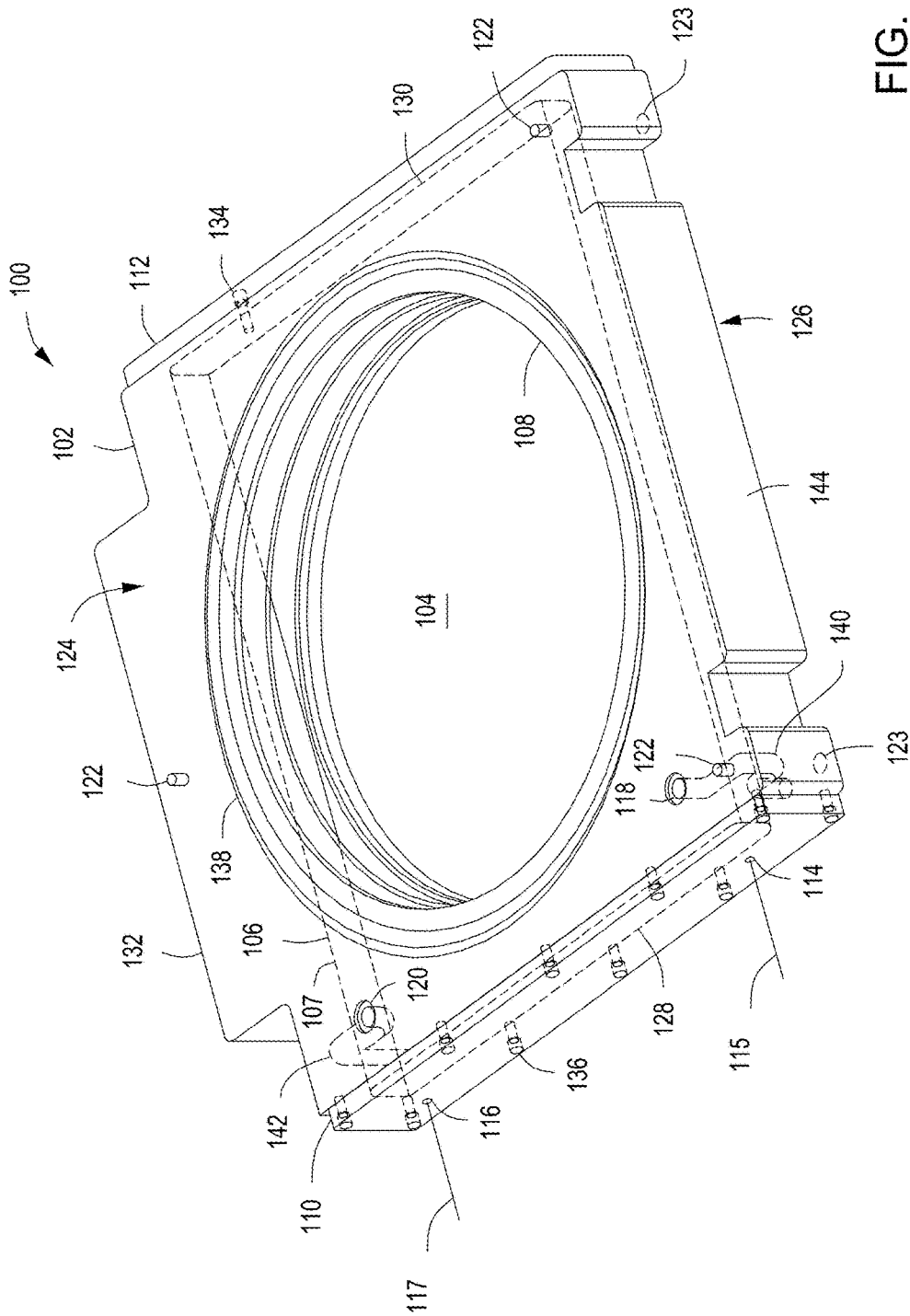
FIG. 1 depicts an apparatus for coupling a hot wire source to a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for improved in-situ cleaning of copper surfaces within a hot-wire chemical vapor deposition (HWCVD) chamber and deposition and removal of self-assembled monolayers within the same HWCVD chamber are provided herein. The inventive methods may advantageously provide methods of cleaning a copper surface (e.g., removal of surface contaminants, oxide layers, or the like) and subsequently depositing and removing of additional layers (e.g., self-assembled monolayers, dielectric layers, UV Blok (barrier low k) layers, etc.) within the same process chamber that is more efficient and less time consuming than conventional substrate cleaning and deposition processes.

Figure 4:
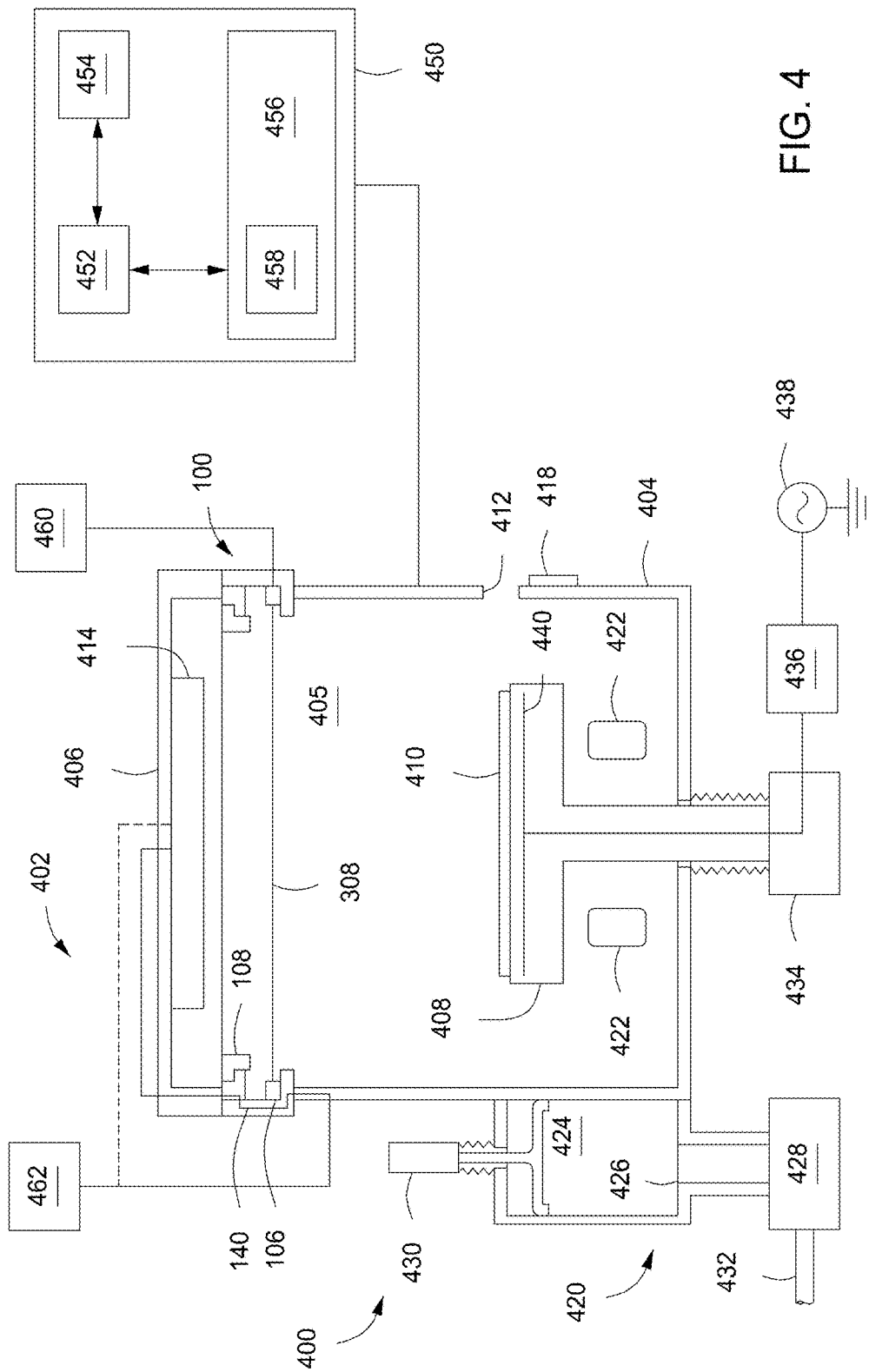
FIG. 4 depicts a process chamber suitable for use with an apparatus for coupling a hot wire source to a process chamber in accordance with some embodiments of the present disclosure.
Figure 5:
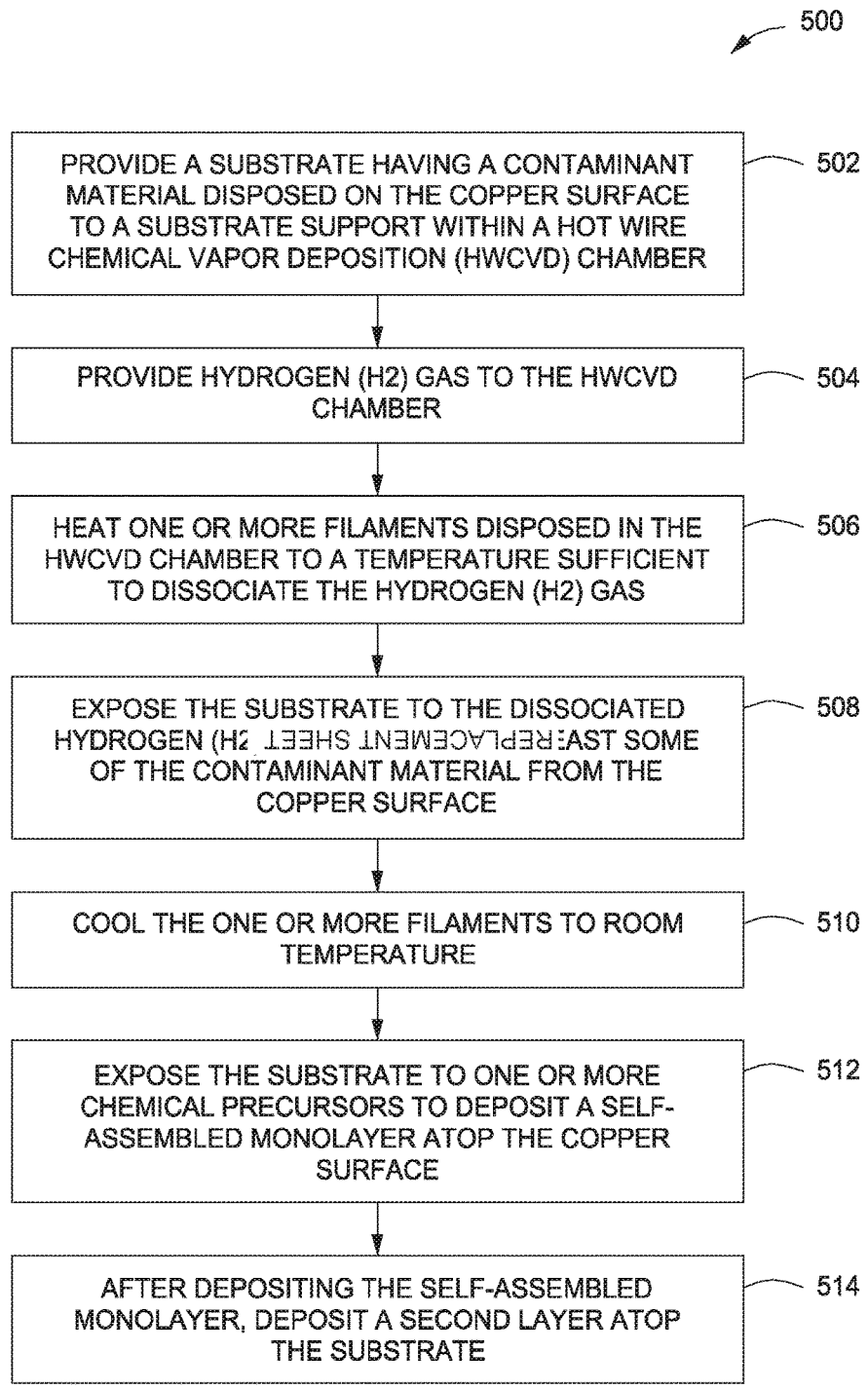
FIG. 5 depicts a flow chart of a method for processing a substrate in accordance with some embodiments of the present disclosure.

FIG. 5 is a flow diagram of a method 500 processing a substrate having an exposed copper surface and an exposed silicon-containing surface in accordance with some embodiments of the present disclosure. FIGS. 6A-6G and 7A-7F are illustrative cross-sectional views of the substrate during different stages of the processing sequence of FIG. 5 in accordance with some embodiments of the present disclosure. The inventive methods may be performed in any HWCVD chamber suitable for processing semiconductor substrates in accordance with embodiments of the present disclosure, such as the HWCVD chamber discussed below with respect to FIGS. 1-4.

The method 500 generally begins at 502 by providing a substrate having a contaminant material disposed on the copper surface to a substrate support within a hot wire chemical vapor deposition (HWCVD) chamber. In some embodiments, the substrate may be a semiconductor wafer, such as a 200 or 300 mm semiconductor wafer. Other size and geometry substrates may also be used.

Figure 6A:
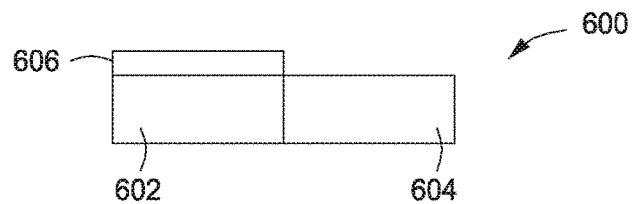
FIGS. 6A-G depict the stages of processing a substrate in accordance with some embodiments of the present disclosure.
Figure 7A:
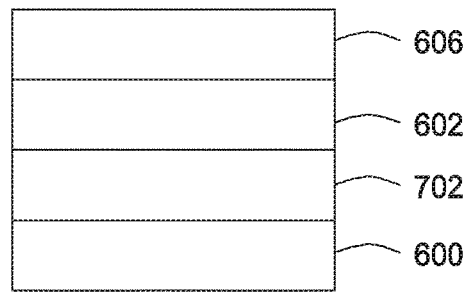
FIGS. 7A-G depict the stages of processing a substrate in accordance with some embodiments of the present disclosure.

In some embodiments, as depicted in FIG. 6A, the substrate 600 comprises an exposed copper surface 602 and an exposed silicon-containing surface 604. In some embodiments, as depicted in FIG. 7A, the substrate 600 comprises a barrier layer 702, for example tantalum or tantalum nitride, disposed atop the substrate 600 and an exposed copper surface 602 atop the barrier layer 702.

The substrate 600 comprises a contaminant material 606 disposed on the copper surface 602. In some embodiments, the contaminant material 606 to be removed may form a layer on the copper surface 602. In some embodiments, the contaminant material 606 may also be present on the silicon-containing surface 604. The contaminant material 606 may be any type of material requiring removal. For example, in some embodiments, the contaminant material 606 formed on the copper surface 602 may comprise oxygen, for example an oxide layer such as surface oxide or native oxide layer comprising $Cu(OH)_2$, $CuO$, $Cu_2O$, and $CuCO_3$. For example, in some embodiments, the contaminant material 606 formed on the silicon-containing surface 604 may comprise oxygen, for example an oxide layer such as surface oxide or native oxide layer comprising silicon oxide. The contaminant material 606 may have a thickness of, for example about 0.5 nm to about 20 nm nanometers.

Next, at 504, a hydrogen ($H_2$) gas may be provided to the HWCVD chamber. The hydrogen ($H_2$) gas may be provided to the HWCVD chamber at any suitable flow rate, for example such as about 100 to about 700 sccm (for example, for a 300 mm wafer process chamber). The flow rates provided herein may vary depending upon the size of the substrate being cleaned and/or of the processing volume of the HWCVD chamber. In some embodiments, the hydrogen ($H_2$) gas may be diluted, for example, with an inert gas such as helium (He), argon (Ar), or the like. In some embodiments, for example, the hydrogen ($H_2$) gas may be diluted with about 5% to about 10% inert gas by volume. The amount of inert gas by volume may be adjusted to provide an amount of hydrogen ($H_2$) necessary to produce a needed amount of energy (when dissociated) to facilitate removal of the contaminant material 606.

In embodiments where the hydrogen ($H_2$) gas is diluted, the hydrogen ($H_2$) gas and inert gas may be mixed prior to providing the gases to the HWCVD chamber. Alternatively, in some embodiments, the hydrogen ($H_2$) gas and inert gas may be co-flowed into the HWCVD chamber via two independent gas supplies and mixed within the HWCVD chamber.

Next at 506, the one or more filaments disposed in the HWCVD chamber are heated to a temperature sufficient to dissociate the hydrogen ($H_2$) gas. The one or more filaments may be any type of filaments, for example the one or more filaments may be composed of tantalum, tungsten, or iridium. In some embodiments, the one or more filaments may be any number of filaments suitable to cause dissociation of the hydrogen ($H_2$) gas, for example 20 to 32 filaments. The one or more filaments may be heated to any temperature suitable to cause dissociation of the hydrogen ($H_2$) gas and, further, to provide a suitable amount of energy needed to remove the contaminant material 606, for example, such as about 1000 to about 2400 degrees Celsius, more precisely about 1400 to about 1900 degrees Celsius. In some embodiments, the temperature may be at least in part dictated by the composition of the contaminant material 606 and, thus, the activation energy of a reaction between the dissociated gas and the contaminant material 606 and/or the amount of energy needed to break the chemical bonds of the contaminant material 606 compounds, thus facilitating removal of the contaminant material 606. In some embodiments, the one or more filaments are coupled to a power source suitable for heating the one or more filaments to the temperature range described above. In some embodiments, a suitable power source provides about 35 V to about 50 V of power at about 85 to about 90 A to the one or more filaments.

Figure 6B:
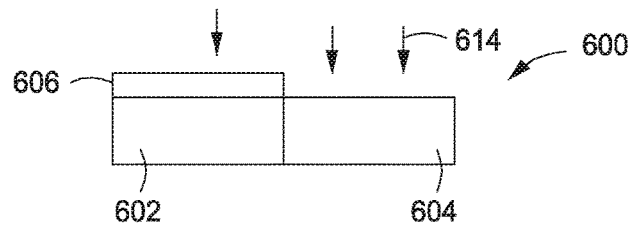
Figure 6C:
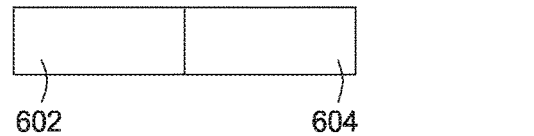
Figure 6D:
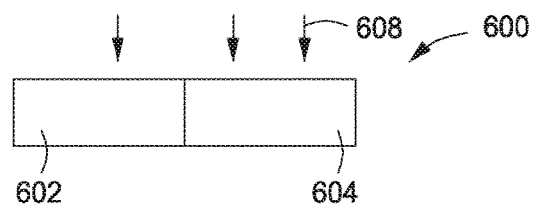
Figure 6E:
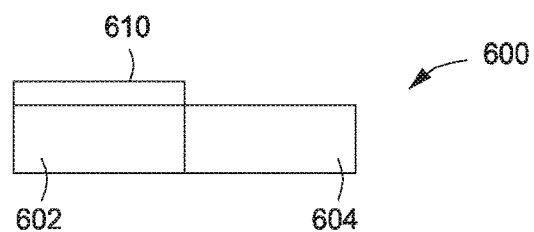
Figure 7B:
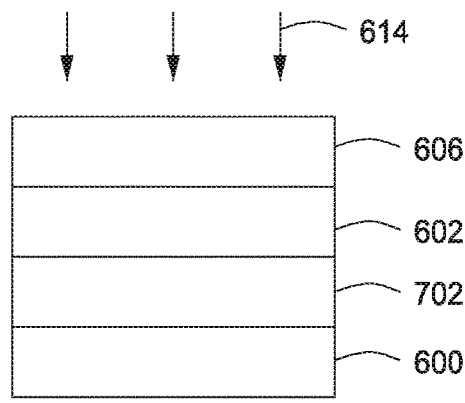
Figure 7C:
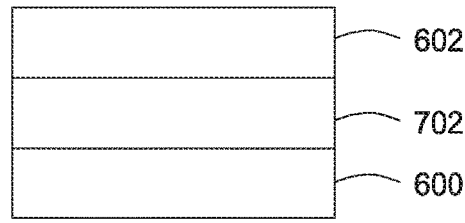
Figure 7D:
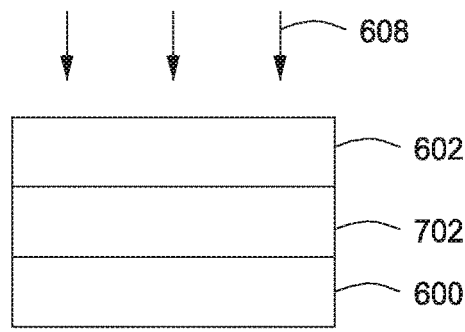
Figure 7E:
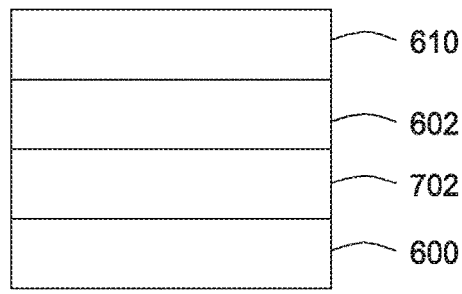

Next, at 508 and as depicted in FIG. 6B and FIG. 7B, the substrate 600 is exposed to the dissociated hydrogen ($H_2$) gas 614 to remove at least some of the contaminant material 606 from the copper surface 602. As depicted in FIG. 6C and FIG. 7C, by exposing the substrate 600 to the dissociated hydrogen ($H_2$) gas 614, hydrogen atoms react with the material disposed on the surface of the substrate (such as the contaminant material 606), thus facilitating removal of the contaminant material 606, thus cleaning the copper surface 602 of the substrate 600. For example, in embodiments where the contaminant material 606 comprises an oxide (e.g., a native oxide layer), the hydrogen atoms react with the oxide causing an oxide reduction and volatile products form, namely molecules of elements or hydrides of the elements and/or lower oxides.

The substrate 600 may be exposed to dissociated hydrogen ($H_2$) gas 614 for any amount of time suitable to facilitate removal of the contaminant material 606 from the copper surface 602. For example, in some embodiments, the substrate 600 may be exposed to the dissociated hydrogen ($H_2$) gas 614 for about 150 to about 900 seconds to remove the contaminant material 606 from the copper-containing surface.

To facilitate removal of the contaminant material 606, the substrate 600 may be positioned under a HWCVD source (e.g., the filaments or wires described below with respect to FIG. 1-4) such that the substrate 600 is exposed to the hydrogen gas and decomposed species thereof. The substrate 600 may be positioned under the HWCVD source on a substrate support (e.g., substrate support pedestal 408 described below with respect to FIG. 4) in a static position or, in some embodiments, dynamically to facilitate cleaning as the substrate 600 passes under the HWCVD source.

In addition to the above, additional process parameters may be utilized to facilitate removal of the contaminant material 606 from the substrate 600 and may be dictated in at least part by the amount of energy needed to remove the contaminant material 606. For example, in some embodiments, the process chamber may be maintained at a pressure of about 100 Torr to about 500 Torr. The chamber pressures provided herein may vary depending upon the size of the substrate being cleaned and/or of the processing volume of the HWCVD chamber. In some embodiments, the substrate 600 may be heated to a temperature of about 50 to about 400 degrees Celsius, more precisely about 50 to about 300 degrees Celsius, to facilitate removal of the contaminant material 606 from the substrate 600. Alternatively, or in combination, in some embodiments, the physical parameters of the HWCVD chamber (e.g., filament diameter, filament to filament distance, or filament to substrate distance) may be adjusted to facilitate removal of the contaminant material 606 from the substrate 600.

In any of the above embodiments, any of the process parameters (e.g., flow rate of hydrogen ($H_2$) gas, ratio of hydrogen gas ($H_2$) to inert gas, substrate temperature, filament temperature, additional process parameters, physical parameters of the HWCVD chamber, or the like) may be adjusted with respect to each other to provide the amount of energy needed to facilitate removal of the contaminant material 606, for example such as the activation energy of a reaction between the dissociated gas and the contaminant material 606 and/or the amount of energy needed to break the chemical bonds of the contaminant material 606 compounds, thus facilitating removal of the contaminant material 606. The inventive methods described above at 504-508 advantageously utilize suitable chemistry to treat the contaminated copper surface to remove the contaminated material and provide semiconductor quality copper with an atomically flat surface.

Next, at 510, the flow of hydrogen gas to the process chamber is stopped and the one or more filaments are allowed to cool to a temperature of about 30 degrees Celsius to about 45 degrees Celsius. For example, the one or more filaments may be allowed to cool for about 60 to about 200 seconds.

Next, at 512 and as depicted in FIG. 6D-6E and FIG. 7D-7E, the substrate 600 in the HWCVD chamber is exposed to one or more chemical precursors 608 to deposit a self-assembled monolayer 610 atop the copper surface 602. The self-assembled monolayer 610 comprises a plurality of organic molecules which self-assemble on a copper surface to form the self-assembled monolayer 610. The self-assembled monolayer 610 may be suitable as a diffusion barrier layer, as depicted in FIGS. 7A-7F or as a sacrificial layer for subsequent dielectric deposition process as depicted in FIGS. 6A-6G.

The one or more chemical precursors 608 used for forming the self-assembled monolayer 610 comprise a head group proximate to the substrate 600 and a terminal tail group away from the substrate 600. These head and tail groups are connected by an intermediate portion referred as a chain. The head group is selected to be a chemical group that bonds to the copper surface 602 and that provides thermal stability above about 300 degrees Celsius (i.e., a chemical group that will not decompose below about 300 degrees Celsius). The head group of the chemical precursor 608 molecule may contain a sulfur-containing group for example a thiol group, such as methanethiol ($CH_3SH$), ethanethiol ($C_2H_5SH$), or butanethiol ($C_4H_9SH$), N-alkanethiols $\{CH_3(CH_2)_{n-1}SH$ where n is 8, 12, 16, 18, 20, 22, or 29, and $CF_3$ and $CF_2$ terminated thiols, for example $CF_3(CF_2)_n(CH_2)_{11})SH$ and $CF_3(CF_2)_9(CH_2)_nSH$ (where n is 2, 11, or 17), and ($CF_3(CH_2)_nSH$) where n is 9-15. In some embodiments, the head group may contain a nitrogen containing group, for example an amine group such as (3-Aminopropyl)triethoxysilane (APTES), (3-Aminopropyl)trimethoxysilane (APTMS), 1,3 damino propane, Ethylene diamine, EDTA, or diethyl amine, methylamine. In some embodiments, the head group may further comprise silanes, phosphonic acid terminated groups and derivatives of phosphonic acid, such as [12-(benzo[b]benzo[4,5]thieno[2,3-d]thiophen-2-yl)dodecyl)]phosphonic acid (BTBT-C 12-PA), N-(2,2,3,3,4,4,4-heptafluoro-butyl)-N'-(undecyl-11-phosphonic acid) perylene-3,4,9,10-tetracarboxylic bisimide PBIF-PA, N-(2,2,3,3,4,4,4-heptafluoro-butyl)-N'-(undecyl-11-phosphonic acid diethyl ester) perylene-3,4,9,10-tetracarboxylic bisimide, 12-cyclohexyldodecylphosphonic acid (CDPA), and 4-cyclohexylbutylphosphonic acid (CBPA). The chemical interaction between the interfacial copper surface 602 and the head group of the chemical precursor 608 molecule immobilizes the copper and inhibits copper ionization and diffusion. The terminal tail group is selected to provide hydrophobicity, for example a contact angle of greater than about 100 degrees Celsius, more precisely about 110 to about 120 degrees. In some embodiments, the tail group may be a functional group such as an alkoxysilane group, such as Octadecyltrimethoxysilane (ODTMS), nonafluorohexyltrimethoxysilane (NFHTMS), 1H,1H,2H,2H-Perfluorodecyltrichlorosilane (PFTS), Chlorodimethyloctadecylsilane (CDODS), (3-MERCAPTOPROPYL)METHYLDIMETHOXYSILANE, Octadecyltrimethoxysilane (OTMS) ($CH_3(CH_2)_{17}Si(OCH_3)_3$, (17-aminoheptadecyl) trimethoxysilane($H_2N(CH_2)_{17}Si(OCH_3)_3$ (AHTMS) also can add Butyltrichlorosilane (BTS)(Chloro silane), and (Trichlorosilyl) Tricosanoate (MTST) ($H_3CO_2C(CH_2)_{22}SiCl_3$).

The chain comprises linear or aromatic hydrocarbons, such as —$CH_2$, $C_6H_5$, $C_6H_4$, $C_2H_5$, or —$CH_2CH_2CH_3$. The impact of the chain on copper diffusion is improved by selecting chemical precursors 608 of suitable chain lengths. For example, longer chain analogues of organic molecules can better inhibit diffusion than chemical precursors 608 with shorter chains, assuming similar terminal groups. For example, the inventors have observed that hydrocarbons having chain lengths of about 8 angstroms or more are better at inhibiting diffusion than hydrocarbons having a smaller chain length, such as about 3 to about 5 angstroms. In some embodiments, 3-mecaptopropyltrimethoxysilane [($HS(CH_2)_3Si(OCH_3)_3$] (MPTMS) and 11-mercatoundecyltrimethoxysilane (MUTMS) are advantageously used for inhibiting copper diffusion while octadecyltrichlorosilane [$CH_3(CH_2)_{17}SiCl_3$], oxydiphthalic acid (ODPA) is used as a sacrificial layer.

In selecting a suitable self-assembled monolayer 610, desirable characteristics include hydrophobicity (i.e. a water contact angle of greater than 100 degrees), thermal stability in order to reduce or prevent decomposition during subsequent dielectric deposition, and ease of removal of the self-assembled monolayer 610. In one embodiment, examples of suitable chemical precursors 608 used to form the self-assembled monolayer 610 atop the copper surface 602 include 3-mecaptopropyltrimethoxysilane [($HS(CH_2)_3Si(OCH_3)_3$] (MPTMS), 11-mercaptoundecyltrimethoxysilane (MUTMS), octadecyltrichlorosilane [$CH_3(CH_2)_{17}SiCl_3$], oxydiphthalic acid (ODPA), Octadecyltrimethoxysilane (ODTMS), Nonafluorohexyltrimethoxysilane (NFHTMS), 1H,1H,2H, 2H-Perfluorodecyltrichlorosilane (PFTS), (3-Aminopropyl) triethoxysilane (APTES), or (3-Aminopropyl)trimethoxysilane (APTMS).

The one or more chemical precursors 608 are introduced to the process chamber by a vapor draw deposition process. In some embodiments, a liquid chemical precursor 608 a placed in an ampoule coupled to the process chamber (for example gas supply 462 coupled to process chamber 402) and heated to a temperature suitable for forming a vapor of the chemical precursor 608, for example a temperature of about 45 degrees Celsius to about 200 degrees Celsius. The vapor from the chemical precursor 608 is drawn from the ampoule, using for example an inert carrier gas (i.e. a carrier gas that does not chemically react with the chemical precursor vapor) such as nitrogen, argon or the like, and delivered to the process chamber In some embodiments, the chemical precursor 608 is a solid precursor (e.g. ODPA or chlorodimethyloctadecylsilane (CDODS)) and is dissolved in a polar solvent, such as IPA, THF, DMSO, DMF, acetonitrile, nitromethane, dichloromethane, propylene carbonate, or the like, prior to heating the solution in the ampoule as described above. In such embodiments, the solvent evaporates in the bubbler and the vapor of the chemical precursor is delivered to the process chamber.

The process conditions to deposit these layers on a copper surface vary and mostly depend on the vapor pressure and stability of these molecules subjected to thermal energy. In some embodiments, process parameters utilized in depositing a self-assembled monolayer 610 atop the copper surface include a chamber temperature of about 45 degrees Celsius to about 65 degrees Celsius, a substrate temperature of about 25 to about 350 degrees Celsius, a chamber pressure of about 75 mTorr to about 500 Torr. In some embodiments, the substrate is exposed to the chemical precursors 608 for a sufficient amount of time to form a self-assembled monolayer 610 having a suitable thickness. For example in some embodiments, the substrate is exposed to the chemical precursors 608 for about 30 seconds to about 900 seconds. In some embodiments, for example where the self-assembled monolayer 610 is utilized as a copper barrier layer, the thickness of self-assembled monolayer 610 is about 8 angstroms to about 16 angstroms in order to optimize device performance. The thickness of the self-assembled monolayer 610 depends on the chain length of the precursor molecule. As described above, chemical precursors 608 having longer chain lengths, and thus forming a thicker self-assembled monolayer 610, provide improved performance of the self-assembled monolayer 610 as a barrier layer as well as a sacrificial layer. The inventors have observed that self-assembled monolayers 610 formed from chemical precursors 608 having longer chain lengths are able to provide improved coverage of the substrate surface and improved ability to withstand subsequent deposition conditions, for example for Blok/Black Diamond material deposition and for dielectric material deposition. The inventors have observed that optimization of the process conditions described above, which can vary depending on the chemical precursor, can advantageously form a self-assembled monolayer 610 having a thickness as described above. In some embodiments, for example where the chemical precursor 608 is MPTMS, the chemical precursor 608 is heated in a bubbler at 65 degrees Celsius and the chemical precursor vapor is provided to the HWCVD process chamber via delivery lines heated to about 75 degrees Celsius to prevent condensation. The HWCVD chamber walls are maintained at about 65 degrees Celsius. The substrate is exposed to the chemical precursor vapor for about 180 seconds at a chamber pressure of about 80 mTorr and a substrate temperature of about 25 to about 85 degrees Celsius.

Figure 6F:
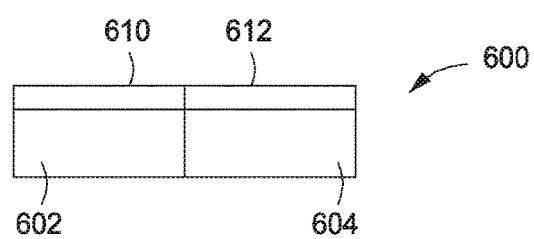
Figure 6G:
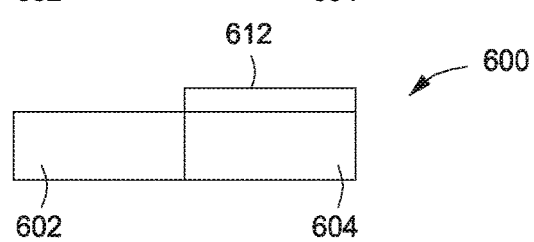
Figure 7F:
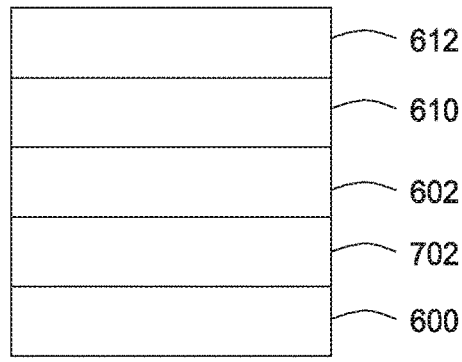

In some embodiments, at 514, and as depicted in FIG. 6F and FIG. 7F, after depositing the self-assembled monolayer 610, a second layer 612 is deposited atop the substrate 600 in the HWCVD chamber. In some embodiments, the self-assembled monolayer 610 may be suitable as a diffusion barrier layer, as depicted in FIGS. 7A-7F. In such embodiments, the second layer 612 is a UV Blok layer. The inventors have observed that depositing the self-assembled monolayer 610 as a copper barrier layer allows the UV Block layer, typically about 100 angstroms, to be thinner, for example about 50 angstroms, thus advantageously reducing fabrication costs and processing time. In some embodiments, the self-assembled monolayer 610 may be suitable as a sacrificial layer as depicted in FIGS. 6A-6G. In such embodiments, the second layer 612 is a dielectric layer. The presence of the self-assembled monolayer 610 layer on the copper surface 602 prevents dielectric deposition on the copper surface due to the hydrophobic nature of the self-assembled monolayer 610. Any suitable dielectric layer 612, such as one or more of hafnium oxide, ($HfO_2$), $Al_2O_3$, $TiO_2$, Ti doped $SiO_2$, silicon oxide ($SiO_2$), silicon nitride (SiN), silicon oxynitride (SiON), or tantalum oxide ($Ta_2O_5$) may deposited in the same process chamber via a chemical deposition process.

Figure 7G:
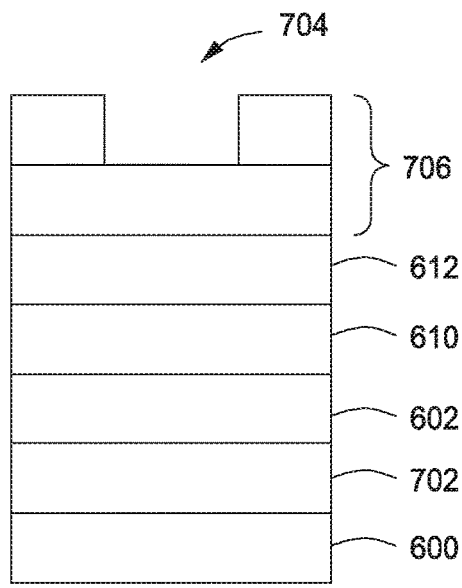

Following deposition of the UV Blok layer in embodiments where the self-assembled monolayer 610 is utilized as a diffusion barrier layer, the method generally 500 ends and the substrate 600 may proceed for further processing In some embodiments, subsequent processes such as deposition, etch, annealing, or the like may be performed to fabricate a finished device, such as a memory device as depicted in FIG. 7G having a feature 704 formed in additional layers 706 (e.g., one or more of metal, metal containing, dielectric or anti-reflective coating (ARC) layers).

Following deposition of the dielectric layer, the self-assembled monolayer 610 utilized as a sacrificial layer is removed as described below. While the self-assembled monolayer 610 may be removed by a wet etch process, the inventors have observed that such processes do not completely remove the self-assembled monolayer 610 and are difficult to employ. In contrast, the inventors have observed that removing the self-assembled monolayer 610 as described below advantageously removes the self-assembled monolayer 610 completely.

To remove the self-assembled monolayer 610 hydrogen ($H_2$) gas is provided to the HWCVD chamber. The hydrogen ($H_2$) gas may be provided to the HWCVD chamber at any suitable flow rate, for example such as about 100 sccm to about 400 sccm (for example, for a 300 mm wafer process chamber). The flow rates provided herein may vary depending upon the size of the substrate being cleaned and/or of the processing volume of the HWCVD chamber. In some embodiments, the hydrogen ($H_2$) gas may be diluted, for example, with an inert gas such as helium (He), argon (Ar), or the like. In some embodiments, for example, the hydrogen ($H_2$) gas may be diluted with about 5% to about 10% inert gas by volume. The amount of inert gas by volume may be adjusted to provide an amount of hydrogen ($H_2$) necessary to produce a needed amount of energy (when dissociated) to facilitate removal of the self-assembled monolayer 610. In embodiments where the hydrogen ($H_2$) gas is diluted, the hydrogen ($H_2$) gas and inert gas may be mixed prior to providing the gases to the HWCVD chamber. Alternatively, in some embodiments, the hydrogen ($H_2$) gas and inert gas may be co-flowed into the HWCVD chamber via two independent gas supplies and mixed within the HWCVD chamber.

Next, the one or more filaments disposed in the HWCVD chamber are heated to a temperature sufficient to dissociate the hydrogen (H2) gas. The temperature may be any temperature suitable to cause dissociation of the hydrogen ($H_2$) gas and, further, to provide a suitable amount of energy needed to remove the self-assembled monolayer 610, for example, such as about 1000 to about 2400 degrees Celsius, more precisely about 1400 to about 1900 degrees Celsius. In some embodiments, the temperature may be at least in part dictated by the composition of the self-assembled monolayer 610 and, thus, the activation energy of a reaction between the dissociated gas and the self-assembled monolayer 610 and/or the amount of energy needed to break the chemical bonds of the self-assembled monolayer 610, thus facilitating removal of the self-assembled monolayer 610.

Next, and as depicted in FIG. 6G, the substrate 600 is exposed to the dissociated hydrogen ($H_2$) gas 614 to remove the self-assembled monolayer 610 from the copper surface 602. By exposing the substrate 600 to the dissociated hydrogen ($H_2$) gas 614, hydrogen atoms react with the self-assembled monolayer 610 molecules, comprising for example carbon, nitrogen, oxygen, sulfur and silicon, thus facilitating removal of the self-assembled monolayer 610 in the form of carbon dioxide, gaseous hydrogen, and water vapor.

The substrate 600 may be exposed to dissociated hydrogen ($H_2$) gas 614 for any amount of time suitable to facilitate removal of the self-assembled monolayer 610. For example, in some embodiments, the substrate may be exposed to the dissociated hydrogen ($H_2$) gas 614 for about 10 to about 600 seconds, more precisely from about 10 to about 300 seconds.

To facilitate removal of the self-assembled monolayer 610 the substrate 600 may be positioned under a HWCVD source (e.g., the filaments or wires described below with respect to FIG. 1-4) such that the substrate 600 is exposed to the hydrogen gas and decomposed species thereof. The substrate 600 may be positioned under the HWCVD source on a substrate support (e.g., substrate support pedestal 408 described below with respect to FIG. 4) in a static position or, in some embodiments, dynamically to facilitate cleaning as the substrate 600 passes under the HWCVD source.

In addition to the above, additional process parameters may be utilized to facilitate removal of the self-assembled monolayer 610 from the substrate 600 and may be dictated in at least part by the amount of energy needed to remove the self-assembled monolayer 610. For example, in some embodiments, the process chamber may be maintained at a pressure of about 80 mTorr to about 400 Torr. The chamber pressures provided herein may vary depending upon the size of the substrate being cleaned and/or of the processing volume of the HWCVD chamber. Alternatively, or in combination, in some embodiments, the physical parameters of the HWCVD chamber (e.g., filament diameter, filament to filament distance, or filament to substrate distance) may be adjusted to facilitate removal of the self-assembled monolayer 610 from the substrate 600.

In any of the above embodiments, any of the process parameters (e.g., flow rate of hydrogen ($H_2$) gas, ratio of hydrogen gas ($H_2$) to inert gas, substrate temperature, filament temperature, additional process parameters, physical parameters of the HWCVD chamber, or the like) may be adjusted with respect to each other to provide the amount of energy needed to facilitate removal of the self-assembled monolayer 610, for example such as the activation energy of a reaction between the dissociated gas and the self-assembled monolayer 610 and/or the amount of energy needed to break the chemical bonds of the self-assembled monolayer 610, thus facilitating removal of the self-assembled monolayer 610.

Furthermore, the inventors have observed that typically cleaning the contaminant material 606 from a substrate, depositing a self-assembled monolayer 610, depositing a subsequent dielectric layer, and removal of the self-assembled monolayer 610 are performed in multiple individual process chambers or in a cluster tool comprising multiple chambers, thus requiring a transfer of substrates. In contrast, the inventors have observed that the method 500 may be performed within a single process chamber, such as the HWCVD process chamber described below in FIGS. 1-4 to advantageously improve process efficiency and wafer throughput.

FIGS. 1-4 depict a hot wire chemical vapor deposition chamber suitable to perform the method 500 described above. Referring to FIG. 1, the apparatus 100 generally includes a housing 102 having a filament assembly (hot wire source) 106 configured to be disposed within the housing 102. The housing 102 is configured to fit within and/or be coupled to a process chamber. For example, the housing 102 may be configured to be coupled between a chamber body and a chamber lid, such as in the process chamber described below with respect to FIG. 4. In some embodiments, the housing 102 generally comprises a top 124, a bottom 126, opposing sides 132, 144 coupling the top 124 to the bottom 126, a first open end 128 and an opposing second end 130 opposing the first open end. The second end 130 may be an open end as well. A recess 107 is formed in the housing between the first open end 128 and the second end 130 to fit the filament assembly 106 within the recess 107. A through hole 104 is formed through the top 124 and bottom 126 of the housing 102 to expose a portion of the filament assembly 106. The housing 102 may be fabricated from any suitable process compatible material, for example, a metal such as aluminum, stainless steel, or the like.

In some embodiments, the top 124 and bottom 126 are configured to couple the housing 102 to, or to interface with, the process chamber (e.g., the bottom 126 to a chamber body and the top 124 to a chamber lid, as depicted in FIG. 4) and may comprise one or more features to facilitate such coupling or interfacing. For example, in some embodiments, one or more pins (three pins 122 shown) may be coupled to and, protrude from, the top 124 of the housing 102. When present, the one or more pins are configured to interface with features of the process chamber to provide a predetermined alignment of the housing 102 with respect to the process chamber. In some embodiments, the bottom 126 may include one or more pins (not shown) that function similar to the one or more pins of the top 124. Alternatively, the bottom 126 may include one or more openings (openings 123 shown in phantom) that can mate with one or more pins extending from the chamber body.

The through hole 104 exposes the filaments (shown in FIGS. 3-3A) of the filament assembly 106 to allow a process gas to be provided to the filaments and a resultant process resource (e.g., a dissociated gas) formed by an interaction of the process gas and the filaments to be provided to an inner volume of the process chamber to facilitate performing a process. In some embodiments, the through hole 104 may have dimensions suitable to expose a predetermined amount of filaments and, in some embodiments, may be dependent on a size of a gas distribution mechanism (e.g., showerhead, nozzles of the like) within the process chamber, an inner volume of the process chamber, or a size of a substrate being processed. In some embodiments, a channel 138 may be formed about the through hole 104 to accommodate an o-ring to facilitate forming an air tight seal between the housing 102 and process chamber when the housing 102 is coupled to the process chamber. In some embodiments, a liner 108 may be disposed on an inner surface of the through hole 104. When present, the liner 108 may protect exposed portions of the housing 102 during processing. The liner 108 may be fabricated from any suitable process compatible material, for example, aluminum, alumina (Al2O3), stainless steel, or the like. Although shown on just the top 124 of the housing 102, either or both of the channel 138 and liner 108 may also be provided on the bottom 126 of the housing 102.

In some embodiments, a first cover plate 110 and a second cover plate 112 may be coupled to the housing 102, to cover the first open end 128 and second end 130, respectively. The first cover plate 110 and the second cover plate 112 may be coupled to the housing 102 via a plurality of fasteners 134, 136. In some embodiments, the first cover plate 110 may comprise one or more electrical feedthroughs disposed through the first cover plate 110 to facilitate providing electrical power to the filament assembly 106. For example, in some embodiments, a first electrical feedthrough 114 may be disposed through the first cover plate 110 to facilitate providing power to the filament assembly 106 (via conductor 115 during use) and a second electrical feedthrough 116 may be disposed through the first cover plate 110 to provide a return path (via conductor 117) for the power provided via the first electrical feedthrough 114.

In some embodiments, one or more gas holes (two gas holes 118, 120 shown) may be disposed in the top 124 of the housing 102 to interface with gas inputs of the process chamber (such as chamber lid) to allow a flow of a process gas through the housing 102 to a gas distribution mechanism (e.g., a showerhead, nozzle, or the like) of the chamber lid when the apparatus is coupled to the process chamber. The one or more gas holes 118, 120 are fluidly coupled to respective gas holes (not shown) disposed in the bottom 126 of the housing 102 via respective conduits 140, 142 (partially shown in phantom) formed in the housing 102. The conduits 140, 142 provide a flow path from the gas holes in the bottom 126 to the gas holes 118, 120 in the top 124 such that the gas holes in the top 124 and the bottom 126 are positioned to align with respective gas holes in a chamber body and a chamber lid to which the housing will be attached (as discussed below with respect to FIG. 4) even when a straight line path is not available (for example due to the opening at the first open end 128). In some embodiments, each gas hole in the top 124 and bottom 126 may include a groove formed around the gas hole to accommodate an o-ring to provide a vacuum seal with components of the process chamber (e.g., a gas conduit) when the housing 102 is coupled to the process chamber.

Figure 2:
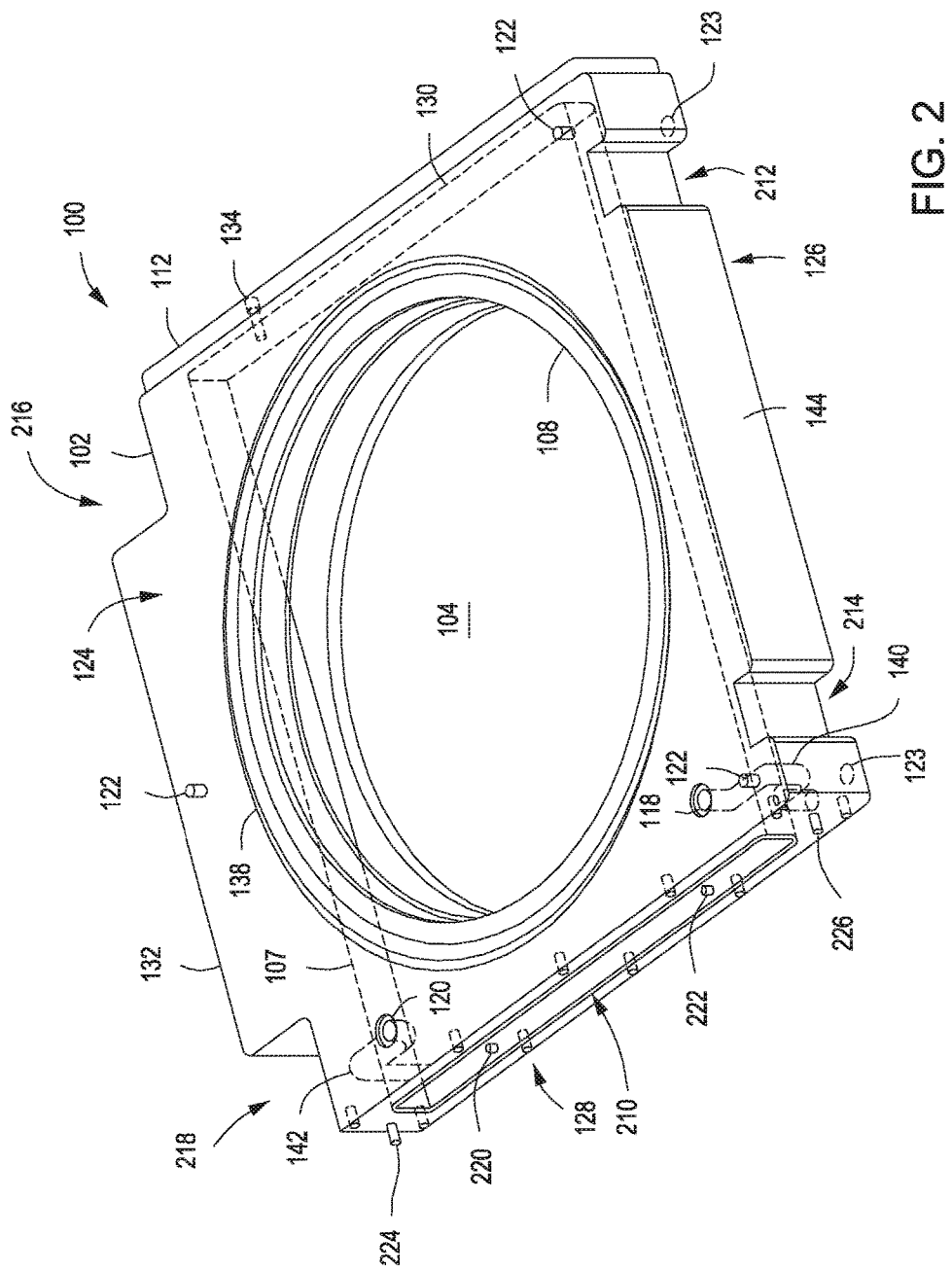
FIG. 2 depicts a portion of an apparatus for coupling a hot wire source to a process chamber in accordance with some embodiments of the present disclosure.

Referring to FIG. 2, in some embodiments, the housing 102 may include a plurality of features 212, 214, 216, 218, (e.g., extensions, cutouts or the like) to interface or with surfaces or features of the process chamber. For example, the housing 102 may have a peripheral geometry that is similar to or identical to the process chamber geometry at the interface of the chamber body and the chamber lid, such that the housing 102 may be interposed between the chamber body and the chamber lid. The bottom 126 of the housing 102 maintains all critical features for alignment, fluid coupling, or the like, as the chamber lid. Similarly, the top 124 of the housing 102 maintains all critical features for alignment, fluid coupling, or the like, as the chamber body. As such, the chamber lid may be coupled to the housing 102 just as the chamber lid would be coupled to the chamber body and the chamber body may be coupled to the housing 102 just as the chamber body would be coupled to the chamber lid.

The first open end 128 is sized to allow the filament assembly (106 in FIG. 1) to be inserted into the housing 102 through the first open end 128. In some embodiments, a groove 210 may be formed about the first open end 128 to accommodate an o-ring to provide an air tight seal between the first cover plate (110 in FIG. 1) and the housing 102 when the first cover plate 110 is coupled to the housing. In some embodiments, one or more pins (two pins 224, 226 shown) may be disposed about the first open end 128, the pins 224, 226 configured to interface with holes formed in the first cover plate 110 to provide alignment of the first cover plate 110 and the housing 102 when the first cover plate 110 is coupled to the housing 102. In some embodiments, a similar groove (not shown) and pins (not shown) may be disposed about the second open end (second end 130 in FIG. 1) that function similar to the groove 210 and pins 224, 226 disposed about the first open end 128.

In some embodiments, one or more holes 220, 222 may be formed in the bottom 126 of the housing 102 within the first open end 128 to receive a fastener to facilitate securing the filament assembly 106 within the housing 102. In some embodiments, the holes 220, 222 may be threaded to interface with mating threads of the fasteners.

Figure 3:
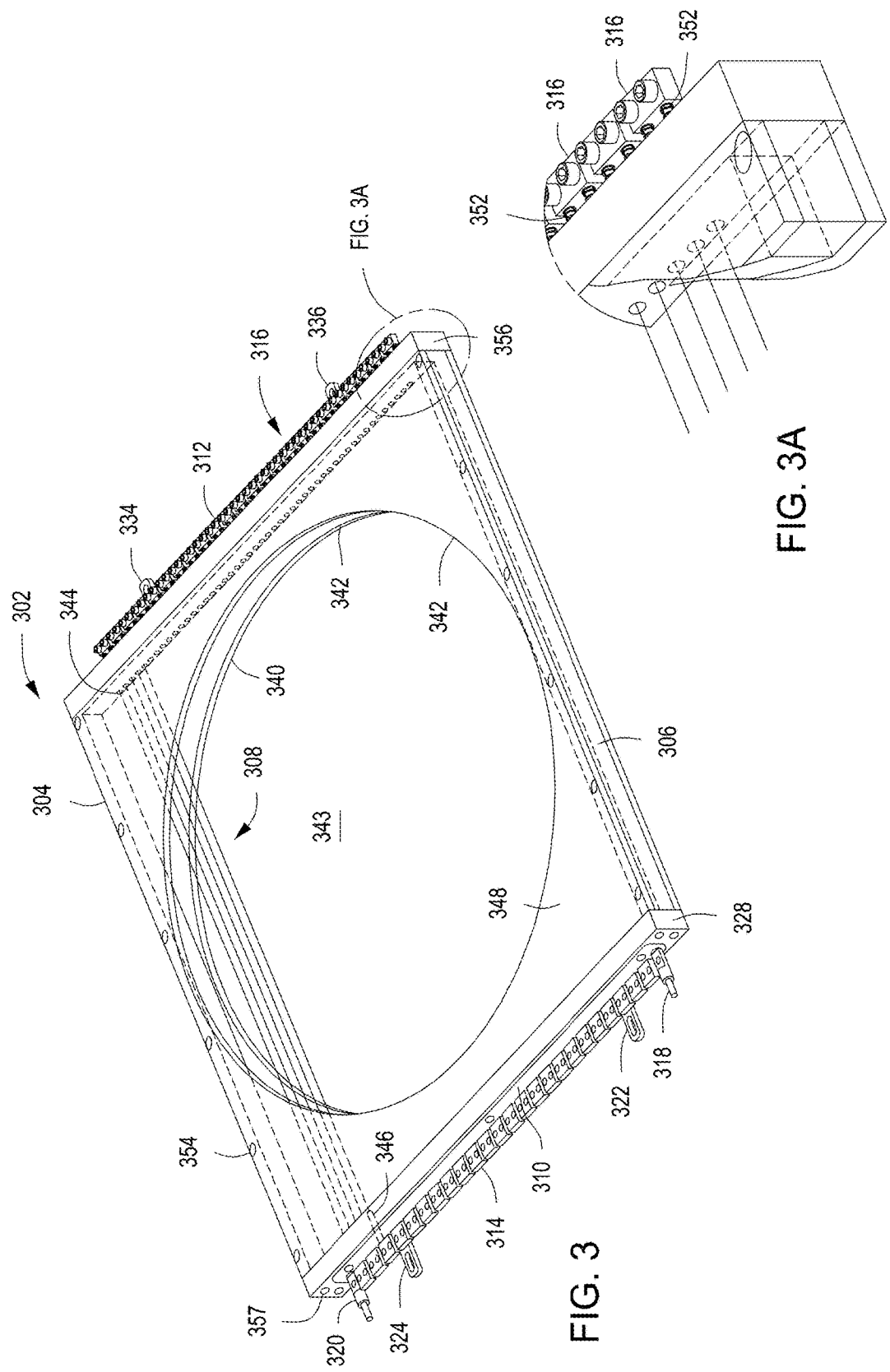
FIG. 3 depicts a portion of an apparatus for coupling a hot wire source to a process chamber in accordance with some embodiments of the present disclosure.

Referring to FIG. 3, in some embodiments, the filament assembly (hot wire source) 106 generally comprises a frame 302, a top 348 and bottom 340. The frame 302 may be fabricated from any suitable process compatible material, for example, a metal such as aluminum, stainless steel, or the like.

The top 348 and bottom 340 cover at least a portion of the frame 302 and, in some embodiments, provide additional structural support to the frame 302. The top 348 and bottom 340 may be coupled to the frame 302 via, for example, a plurality of fasteners 354. A through hole 342 is disposed through each of the top 348 and bottom 340 to form an opening 343 that corresponds with the opening defined by the through hole 104 in the top 124 and bottom 126 of the housing 102 (described above).

The frame 302 is generally rectangular in shape and sized to fit within the first open end (128 in FIGS. 1 and 2) to allow the filament assembly 106 to be inserted into the housing 102. Providing a frame 302 that is removable from the housing assembly allows for the filament assembly 106 to be easily removed and repaired (for example to replace a broken filament) or replaced with, for example, a different filament assembly 106 having the same or a different filament configuration to facilitate performing a predetermined process without removing the chamber lid. The frame 302 generally comprises a first end 310, a second end 312 and sides 304, 306 coupling the first end 310 to the second end 312.

In some embodiments, each of the first end 310 and second end 312 comprise a plurality of connectors 314, 316 configured to hold the plurality of filaments 308 within the frame 302 at a predetermined spacing and/or a predetermined tension and to provide electrical contact to the plurality of filaments 308. In some embodiments, a set of the plurality of connectors (e.g., the connectors 316 of the second end 312) may comprise springs 352 to exert a tension on the plurality of filaments 308 to prevent the filaments from sagging during processing, for example such as shown in FIG. 3A. In some embodiments, a tension of the filament 308 may be adjustable via either or both of the connectors 314, 316. Referring back to FIG. 3, in some embodiments, each of the first end 310 and second end 312 comprise a plurality of through holes 344, 346 to allow the plurality of filaments 308 to pass through the first end 310 and second end 312 to the connectors 314, 316. In such embodiments, each of the through holes 344, 346 may have a diameter sufficient to prevent contact with the filament and may optionally include an electrically insulating material disposed within each of the through holes 344, 346 to facilitate electrically isolating the plurality of filaments 308 from the first end 310 and second end 312.

In some embodiments, each of the first end 310 and the second end 312 comprises a plurality of tabs 322, 324, 334, 336 configured to correspond with the holes 220, 222 formed in the housing 102 to facilitate securing the filament assembly 106 within the housing 102. In some embodiments, each of the first end 310 and second end 312 may have an outer member 328, 356 to couple the first end 310 and the second end 312 to the frame 302. The outer member 328, 356 includes a plurality of through holes 357 to receive fasteners to couple the first end 310 and second end 312 to the sides 304, 306.

In some embodiments, the first end 310 comprises a first electrical coupling 318 and a second electrical coupling 320 to interface with the first electrical feedthrough 114 and second electrical feedthrough 116 of the housing 102 (described above) to facilitate providing electrical power to the plurality of filaments 308. In such embodiments, the first electrical feedthrough 114 and second electrical feedthrough 116 are electrically coupled to the plurality of filaments 308 to facilitate providing power to the plurality of filaments 308.

Power may be provided to the plurality of filaments 308 as a group (e.g., in a single zone), or in multiple zones each comprising one or more filaments 308. For example, in some embodiments, the one or more filaments 308 may be configured in a single zone. In such embodiments, the one or more filaments 308 may be electrically coupled to one another in parallel and provided power from a single power source. Alternatively, in some embodiments, the one or more filaments 308 may be configured in a plurality of zones. The one or more filaments 308 may be configured in any number of zones, for example such as two zones or three zones. In some embodiments, each zone of the plurality of zones may be coupled have a separate power source to allow for independent adjustment of each zone of the plurality of zones. Examples of such zoned configurations that may be used in combination with the one or more filaments 308 described herein is disclosed in greater detail in U.S. patent application Ser. No. 13/723,409, filed Dec. 21, 2012, entitled, "Methods and Apparatus for Cleaning Substrate Surfaces with Hydrogen".

Although only two filaments of the plurality of filaments 308 are shown in FIG. 3, the plurality of filaments 308 may include any number of filaments sufficient to cover a predetermined area within the frame 302. In some embodiments, the plurality of filaments (wires) 308 may be separate wires, or may be a single wire routed back and forth across the frame 302. The plurality of filaments 308 may comprise any suitable conductive material, for example, such tungsten, tantalum, iridium, nickel-chrome, palladium, or the like. The plurality of filaments 308 may have any thickness, geometry and/or density suitable to facilitate a predetermined process in the process chamber, and may be dependent on, for example, a substrate composition, materials and/or process gases utilized in the process and the dimensions of the process chamber. In some embodiments, a distance between each filament of the plurality of filaments 308 (i.e., the wire to wire distance) may be varied in accordance with a particular application.

FIG. 4 depicts a system 400 suitable for processing a substrate in accordance with some embodiments of the present disclosure. The system 400 may comprise a controller 450 and a process chamber 402 having an exhaust system 420 for removing excess process gases, processing by-products, or the like, from the interior of the process chamber 402. Exemplary process chambers may include chemical vapor deposition (CVD) or other process chambers, available from Applied Materials, Inc. of Santa Clara, Calif. Other suitable process chambers may similarly be used.

The process chamber 402 has a chamber body 404 and a chamber lid 406 generally enclosing a processing volume 405. The processing volume 405 may be defined, for example, between a substrate support pedestal 408 disposed within the process chamber 402 for supporting a substrate 410 thereupon during processing and one or more gas inlets, such as a showerhead 414 coupled to the chamber lid 406 and/or nozzles provided at predetermined locations. In some embodiments, the inventive apparatus 100 may be coupled to the process chamber 402 disposed between the chamber body 404 and the chamber lid 406. In such embodiments, one or more process gases may be provided to the filaments 308 of the filament assembly (hot wire source) 106 via the showerhead 414 to facilitate a process within the processing volume 405. A power supply 460 (e.g., a DC power supply) is coupled to the apparatus 100 to provide power to the filaments 308.

In some embodiments, the substrate support pedestal 408 may include a mechanism that retains or supports the substrate 410 on the surface of the substrate support pedestal 408, such as an electrostatic chuck, a vacuum chuck, a substrate retaining clamp, or the like (not shown). In some embodiments, the substrate support pedestal 408 may include mechanisms for controlling the substrate temperature (such as heating and/or cooling devices, not shown) and/or for controlling the species flux and/or ion energy proximate the substrate surface.

For example, in some embodiments, the substrate support pedestal 408 may include an RF bias electrode 440. The RF bias electrode 440 may be coupled to one or more bias power sources (one bias power source 438 shown) through one or more respective matching networks (matching network 436 shown). The one or more bias power sources may be capable of producing up to 12,000 W at a frequency of about 2 MHz, or about 13.56 MHz, or about 60 Mhz. In some embodiments, two bias power sources may be provided for coupling RF power through respective matching networks to the RF bias electrode 440 at respective frequencies of about 2 MHz and about 13.56 MHz. In some embodiments, three bias power sources may be provided for coupling RF power through respective matching networks to the RF bias electrode 440 at respective frequencies of about 2 MHz, about 13.56 MHz, and about 60 Mhz. The at least one bias power source may provide either continuous or pulsed power. In some embodiments, the bias power source alternatively may be a DC or pulsed DC source.

The substrate 410 may enter the process chamber 402 via an opening 412 in a wall of the process chamber 402. The opening 412 may be selectively sealed via a slit valve 418, or other mechanism for selectively providing access to the interior of the chamber through the opening 412. The substrate support pedestal 408 may be coupled to a lift mechanism 434 that may control the position of the substrate support pedestal 408 between a lower position (as shown) suitable for transferring substrates into and out of the chamber via the opening 412 and a selectable upper position suitable for processing. The process position may be selected to maximize process uniformity for a particular process. When in at least one of the elevated processing positions, the substrate support pedestal 408 may be disposed above the opening 412 to provide a symmetrical processing region.

A gas supply 462 may be coupled to the apparatus 100 and/or showerhead 414 to provide one or more process gases to the apparatus 100 and/or showerhead 414 for processing. For example, the gas supply 462 may be coupled to the chamber body 404 with the provided gas traveling through the chamber body 404, through the housing 102 (e.g., via conduits 140), and through the chamber lid 406 to the showerhead 414. Alternatively, the gas supply 462 may be coupled directly to the showerhead, as shown in phantom. The apparatus 100 may advantageously be configured to interface with the process chamber 402. Although a showerhead 414 is shown in FIG. 4, additional or alternative gas inlets may be provided such as nozzles or inlets disposed in the ceiling or on the sidewalls of the process chamber 402 or at other locations suitable for providing gases to the process chamber 402, such as the base of the process chamber, the periphery of the substrate support pedestal, or the like.

The exhaust system 420 generally includes a pumping plenum 424 and one or more conduits that couple the pumping plenum 424 to the inner volume (and generally, the processing volume 405) of the process chamber 402, for example via one or more inlets 422 (two inlets shown in FIG. 4). A vacuum pump 428 may be coupled to the pumping plenum 424 via a pumping port 426 for pumping out the exhaust gases from the process chamber 402. The vacuum pump 428 may be fluidly coupled to an exhaust outlet 432 for routing the exhaust as needed to appropriate exhaust handling equipment. A valve 430 (such as a gate valve, or the like) may be disposed in the pumping plenum 424 to facilitate control of the flow rate of the exhaust gases in combination with the operation of the vacuum pump 428. Although a z-motion gate valve is shown, any suitable, process compatible valve for controlling the flow of the exhaust may be utilized.

To facilitate control of the process chamber 402 as described above, the controller 450 may be one of any form of general-purpose computer processor that can be used in an industrial setting for controlling various chambers and sub-processors. The memory, or computer-readable medium, 456 of the CPU 452 may be one or more of readily available memory such as random access memory (RAM), read only memory (ROM), floppy disk, hard disk, or any other form of digital storage, local or remote. The support circuits 454 are coupled to the CPU 452 for supporting the processor in a conventional manner. These circuits include cache, power supplies, clock circuits, input/output circuitry and subsystems, and the like.

Processes may generally be stored in the memory 456 as a software routine 458 that, when executed by the CPU 452, causes the process chamber 402 to perform processes of the present disclosure. The software routine 458 may also be stored and/or executed by a second CPU (not shown) that is remotely located from the hardware being controlled by the CPU 452. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine 458 may be executed after the substrate 410 is positioned on the substrate support pedestal 408. The software routine 458, when executed by the CPU 452, transforms the general purpose computer into a specific purpose computer (controller) 450 that controls the chamber operation such that the processes are performed.

While the foregoing is directed to embodiments of the present disclosure, other and further embodiments of the disclosure may be devised without departing from the basic scope thereof.

The invention claimed is:

1. A method of processing a substrate having an exposed copper surface, comprising:
   (a) providing a substrate having a contaminant material disposed on the copper surface to a substrate support within a hot wire chemical vapor deposition (HWCVD) chamber;
   (b) providing hydrogen ($H_2$) gas to the HWCVD chamber;
   (c) heating one or more filaments disposed in the HWCVD chamber to a temperature sufficient to dissociate the hydrogen ($H_2$) gas;
   (d) exposing the substrate to the dissociated hydrogen ($H_2$) gas to remove at least some of the contaminant material from the copper surface;
   (e) cooling the one or more filaments to room temperature;
   (f) exposing the substrate in the HWCVD chamber to one or more chemical precursors to deposit a self-assembled monolayer atop the copper surface; and
   (g) depositing a second layer atop the substrate.

2. The method of claim 1, wherein depositing the second layer further comprises:
   after depositing the self-assembled monolayer, selectively depositing a dielectric layer atop an exposed silicon-containing surface of the substrate in the HWCVD chamber;
   providing hydrogen ($H_2$) gas to the HWCVD chamber;
   heating the one or more filaments disposed in the HWCVD chamber to a temperature sufficient to dissociate the hydrogen ($H_2$) gas; and
   exposing the substrate to the dissociated hydrogen ($H_2$) gas to remove the self-assembled monolayer from the copper surface.

3. The method of claim 2, wherein a temperature of the substrate during removal of the self-assembled monolayer from the copper surface is about 25 to about 350 degrees Celsius.

4. The method of claim 1, wherein depositing the second layer further comprises:
   depositing a UV Block layer atop the self-assembled monolayer.

5. The method of claim 1, wherein the filament temperature is about 1000 to about 2400 degrees Celsius.

6. The method of claim 1, wherein the one or more filaments comprise 20 to 32 filaments.

7. The method of claim 1, wherein the one or more filaments are composed of tantalum, tungsten, or iridium.

8. The method of claim 1, wherein during (b)-(d), the substrate support is heated to about 50 to about 400 degrees Celsius.

9. The method of claim 1, wherein the self-assembled monolayer has a thickness of about 12 to about 13 angstroms.

10. The method of claim 1, wherein the one or more chemical precursors comprise at least one of 3-mecaptopropyltrimethoxysilane, 11-mercaptoundecyltrimethoxysilane, octadecyltrimethoxysilane (ODTMS), nonafluorohexylmethyltrimethoxysilane (NFHTMS), 1H,1H,2H,2H-perfluorodecyltrichlorosilane (PFTS), (3-aminopropyl)triethoxysilane(APTES), (3-aminopropyl)trimethoxysilane(APTMS), octadecyltrichlorosilane, oxydiphthalic acid (ODPA), chlorodimethyloctadecylsilane (CDODS), (3-mercaptopropyl) methyldimethoxysilane, octadecyltrimethoxysilane(OTMS) $(CH_3(CH_2)_{17}Si(OCH_3)_3$, (17-aminoheptadecyl) trimethoxysilane($H_2N(CH_2)_{17}Si(OCH_3)_3$ (AHTMS) butyltrichlorosilane (BTS)(Chloro silane), or (trichlorosilyl) tricosanoate (MTST) $(H_3CO_2C(CH_2)_{22}SiCl_3)$.

11. The method of claim 1, wherein exposing the substrate to one or more chemical precursors further comprises: heating one or more ampoules containing one or more chemical precursors; and drawing a vapor of the one or more chemical precursors from the one or more ampoules using a carrier gas.

12. The method of claim 11, further comprising heating the one or more ampoules to a temperature of about 45 degrees Celsius to about 200 degrees Celsius.

13. The method of claim 1, wherein a temperature of the substrate during deposition of the self-assembled monolayer is about 25 to about 350 degrees Celsius.

14. The method of claim 1, wherein a pressure in the HWCVD chamber during deposition of the self-assembled monolayer is about 80 mTorr to about 500 Torr.

15. The method of claim 1, wherein the substrate is exposed to the one or more chemical precursors for about 30 seconds to about 600 seconds.

16. A method of processing a substrate having an exposed copper surface, comprising:
   providing a substrate having a contaminant material disposed on the copper surface to a substrate support within a hot wire chemical vapor deposition (HWCVD) chamber;
   providing hydrogen ($H_2$) gas to the HWCVD chamber;
   heating one or more filaments disposed in the HWCVD chamber to a temperature of about 1000 to about 2400 degrees Celsius to dissociate the hydrogen ($H_2$) gas and heating the substrate support to a temperature of about 50 to about 400 degrees Celsius;
   exposing the substrate to the dissociated hydrogen ($H_2$) gas to remove at least some of the contaminant material from the copper surface;
   cooling the one or more filaments to room temperature;
   heating one or more ampoules coupled to the HWCVD chamber and containing one or more chemical precursors to a temperature of about 25 to about 200 degrees Celsius;
   drawing a vapor of the one or more chemical precursors from the one or more ampoules using a carrier gas;
   exposing the substrate in the HWCVD chamber to one or more chemical precursors to deposit a self-assembled monolayer atop the copper surface, wherein the substrate is heated to a temperature of about 25 to about 350 degrees Celsius; wherein a pressure in the HWCVD chamber during deposition of the self-assembled monolayer is about 80 mTorr to about 500 Torr, and wherein the substrate is exposed to the one or more chemical precursors for about 30 to about 600 seconds; and
   depositing a second layer atop the substrate.

17. The method of claim 16, wherein depositing the second layer further comprises:
   after depositing the self-assembled monolayer, selectively depositing a dielectric layer atop an exposed silicon-containing surface of the substrate in the HWCVD chamber;
   providing hydrogen ($H_2$) gas to the HWCVD chamber;
   heating the one or more filaments disposed in the HWCVD chamber to a temperature sufficient to dissociate the hydrogen ($H_2$) gas; and
   exposing the substrate to the dissociated hydrogen ($H_2$) gas to remove the self-assembled monolayer from the copper surface, wherein a temperature of the substrate during removal of the self-assembled monolayer from the copper surface is about 150 to about 350 degrees Celsius.

18. The method of claim 16, wherein depositing the second layer further comprises:
   depositing a UV Block layer atop the self-assembled monolayer.

19. A non-transitory computer readable medium, having instructions stored thereon which, when executed, cause a process chamber to perform a method of processing a substrate having an exposed copper surface and an exposed silicon-containing surface, the method comprising:
   (a) providing a substrate having a contaminant material disposed on the copper surface to a substrate support within a hot wire chemical vapor deposition (HWCVD) chamber;
   (b) providing hydrogen ($H_2$) gas to the HWCVD chamber;
   (c) heating one or more filaments disposed in the HWCVD chamber to a temperature sufficient to dissociate the hydrogen ($H_2$) gas;
   (d) exposing the substrate to the dissociated hydrogen ($H_2$) gas to remove at least some of the contaminant material from the copper surface;
   (e) cooling the one or more filaments to room temperature;
   (f) exposing the substrate in the HWCVD chamber to one or more chemical precursors to deposit a self-assembled monolayer atop the copper surface; and
   (g) depositing a second layer atop the substrate.

20. The non-transitory computer readable medium of claim 19, wherein depositing the second layer further comprises:
   after depositing the self-assembled monolayer, selectively depositing a dielectric layer atop the silicon-containing surface of the substrate in the HWCVD chamber;
   providing hydrogen ($H_2$) gas to the HWCVD chamber;
   heating the one or more filaments disposed in the HWCVD chamber to a temperature sufficient to dissociate the hydrogen ($H_2$) gas; and
   exposing the substrate to the dissociated hydrogen ($H_2$) gas to remove the self-assembled monolayer from the copper surface.

* * * * *